(12) United States Patent
Venkatraman et al.

(10) Patent No.: US 11,225,714 B2
(45) Date of Patent: *Jan. 18, 2022

(54) ELECTROCHEMICAL DOPING OF THIN METAL LAYERS EMPLOYING UNDERPOTENTIAL DEPOSITION AND THERMAL TREATMENT

(71) Applicant: Lam Research Corporation, Fremont, CA (US)

(72) Inventors: Kailash Venkatraman, Sunnyvale, CA (US); Yezdi Dordi, Palo Alto, CA (US); Aniruddha Joi, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 78 days.

This patent is subject to a terminal disclaimer.

(21) Appl. No.: 16/669,516

(22) Filed: Oct. 31, 2019

(65) Prior Publication Data

US 2020/0063256 A1 Feb. 27, 2020

Related U.S. Application Data

(63) Continuation of application No. 15/701,265, filed on Sep. 11, 2017, now Pat. No. 10,501,846.

(51) Int. Cl.
*C23C 16/00* (2006.01)
*C23C 16/40* (2006.01)
(Continued)

(52) U.S. Cl.
CPC .......... *C23C 16/406* (2013.01); *C23C 16/045* (2013.01); *C23C 16/06* (2013.01);
(Continued)

(58) Field of Classification Search
CPC .......... H01L 12/00; H01L 23/00; C23C 16/00
See application file for complete search history.

(56) References Cited

U.S. PATENT DOCUMENTS 6,284,595 B1 * 9/2001 Kato ........................ H01L 28/92
257/E21.02
6,737,313 B1 * 5/2004 Marsh ............... H01L 21/28556
438/240

(Continued)

FOREIGN PATENT DOCUMENTS

KR 10-2009-0015633 A 2/2009
KR 10-2016-0108784 A 9/2016

OTHER PUBLICATIONS

PCT International Search Report and Written Opinion of the International Searching Authority issued in related International Patent Application No. PCT/US2018/049815 dated Jan. 3, 2019 (PCT Forms ISA 220, 210, 237) (16 total pages).

*Primary Examiner* — David P Turocy
*Assistant Examiner* — Mohammad Mayy
(74) *Attorney, Agent, or Firm* — Penilla IP, APC

(57) ABSTRACT

A method is provided, including the following operations: depositing a liner in a feature of a substrate; depositing a monolayer of zinc over the liner; after depositing the monolayer of zinc, performing a thermal treatment on the substrate, wherein the thermal treatment is configured to cause migration of the zinc to an interface of the liner and an oxide layer of the substrate, the migration of the zinc producing an adhesive barrier at the interface that improves adhesion between the liner and the oxide layer of the substrate; repeating the operations of depositing the monolayer of zinc and performing the thermal treatment until a predefined number of cycles is reached.

19 Claims, 8 Drawing Sheets

(51) Int. Cl.
*H01L 21/02* (2006.01)
*C23C 16/06* (2006.01)
*C23C 18/54* (2006.01)
*H01L 21/768* (2006.01)
*C23C 18/16* (2006.01)
*C23C 16/04* (2006.01)
*C23C 18/38* (2006.01)

(52) U.S. Cl.
CPC ........ *C23C 16/407* (2013.01); *C23C 18/1692* (2013.01); *C23C 18/54* (2013.01); *H01L 21/02271* (2013.01); *H01L 21/76838* (2013.01); *C23C 16/408* (2013.01); *C23C 18/1653* (2013.01); *C23C 18/38* (2013.01); *H01L 21/02266* (2013.01); *H01L 21/76871* (2013.01)

(56) References Cited

U.S. PATENT DOCUMENTS

| | | | |
|---|---|---|---|
| 2002/0094673 A1* | 7/2002 | Dubin | H01L 21/288 438/626 |
| 2003/0085470 A1 | 5/2003 | Hasunuma | |
| 2008/0182012 A1 | 7/2008 | Fisher et al. | |
| 2008/0296768 A1* | 12/2008 | Chebiam | H01L 21/76846 257/751 |
| 2009/0104777 A1 | 4/2009 | Kim et al. | |
| 2009/0160055 A1 | 6/2009 | LaVoie | |
| 2012/0141667 A1* | 6/2012 | Kim | C23C 16/06 427/123 |
| 2013/0228923 A1 | 9/2013 | Kolics et al. | |
| 2013/0320505 A1* | 12/2013 | Emesh | H01L 21/76846 257/621 |
| 2014/0264876 A1 | 9/2014 | Ryan et al. | |

* cited by examiner

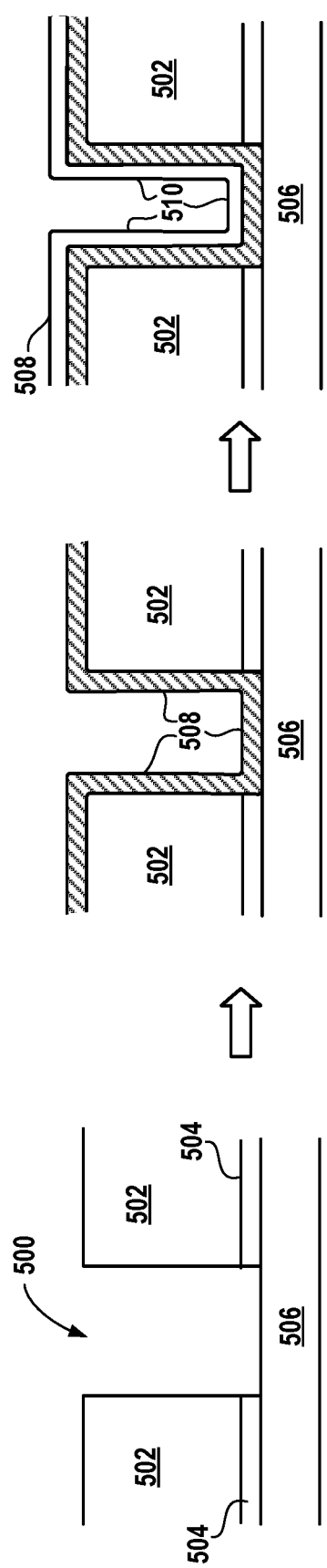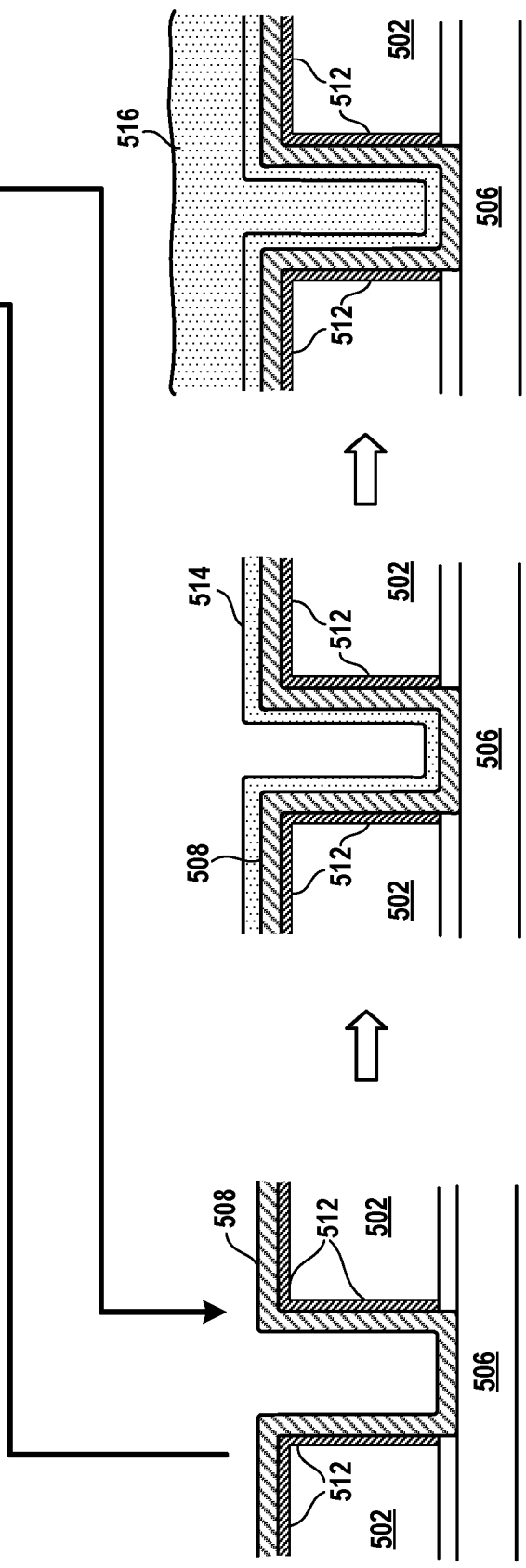

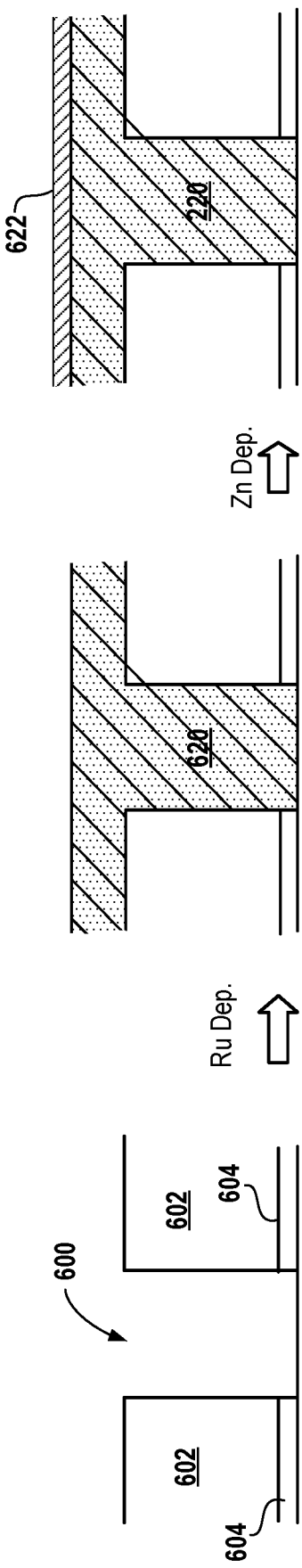
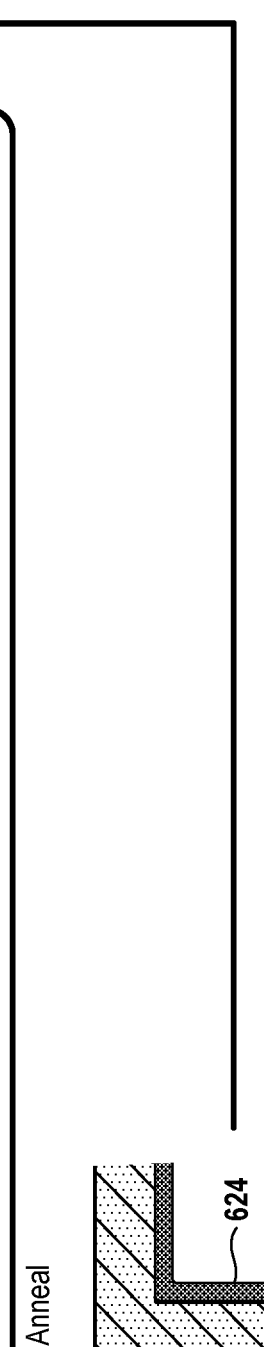
Fig. 6A
Fig. 6B
Fig. 6C
Fig. 6D

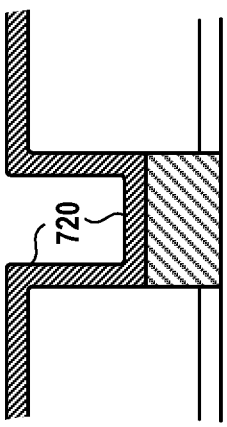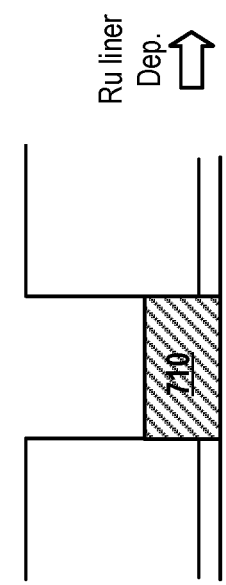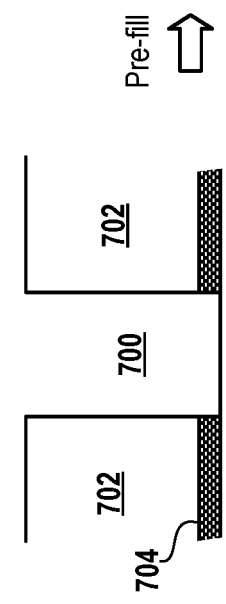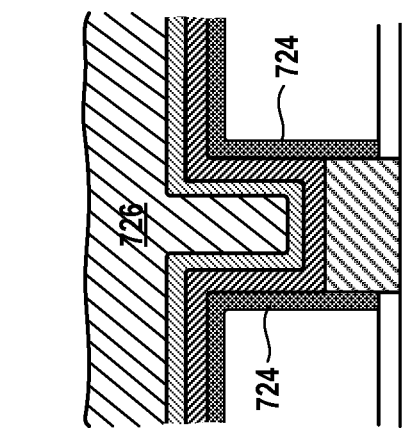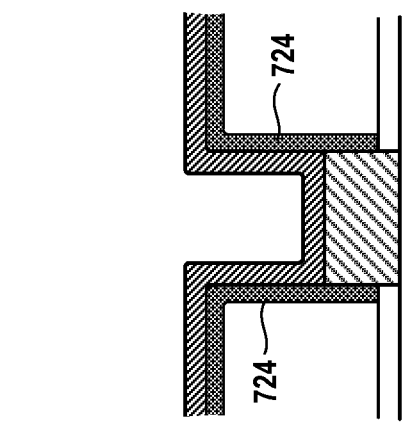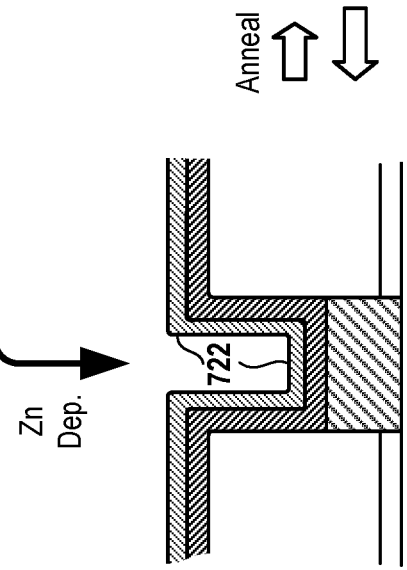

ELECTROCHEMICAL DOPING OF THIN METAL LAYERS EMPLOYING UNDERPOTENTIAL DEPOSITION AND THERMAL TREATMENT

FIELD OF THE INVENTION

Implementations of the present disclosure relate to electrochemical doping of thin metal layers employing underpotential deposition and thermal treatment, and related methods, apparatus, and systems.

DESCRIPTION OF THE RELATED ART

Copper (Cu) is used as an interconnect material for the fabrication of advanced semiconductor devices. Under a current process, the Cu metallization scheme entails deposition of a Cu/Ru/TaN (or Cu/Co/TaN) stack in the interconnect structure, e.g. over an underlying conductor and $SiO_2$. TaN serves a barrier layer to prevent the Cu from diffusing into the $SiO_2$ layer and Ru (or Co) acts as a liner to enable Cu deposition providing lower electrical resistance than TaN. However, with the continuous shrinkage in the size of the technology nodes, it is challenging to scale the barrier layer beyond certain critical dimensions.

SUMMARY

Implementations of the present disclosure provide an electrochemical technique of doping liner materials (such as Ru, Co) with an electronegative element X, (where X=elements as or more electronegative than Zn) employing underpotential deposition. The doped element (X) can be driven to the metal oxide interface with a suitable heat treatment process. The vacancies and grain boundaries in liner materials are stuffed with X, the deposited X reacts with SiO2 forming a metal silicate layer between the oxide and the metal interface. This technique enables a barrier-less metallization scheme providing superior adhesion and barrier properties for the future technology nodes.

In some implementations, a method is provided, including the following operations: depositing a ruthenium liner in a feature of a substrate; depositing a monolayer of zinc over the ruthenium liner; after depositing the monolayer of zinc, performing a thermal treatment on the substrate, wherein the thermal treatment is configured to cause migration of the zinc to an interface of the ruthenium liner and an oxide layer of the substrate, the migration of the zinc producing an adhesive barrier at the interface that improves adhesion between the ruthenium liner and the oxide layer of the substrate; repeating the operations of depositing the monolayer of zinc and performing the thermal treatment until a predefined number of cycles is reached.

In some implementations, depositing the monolayer of zinc is performed by an underpotential deposition process, the underpotential deposition process including deposition from a plating solution at a potential that avoids electroplating from the plating solution.

In some implementations, depositing the monolayer of zinc is performed by an electroless underpotential deposition process.

In some implementations, the thermal treatment is defined by annealing at a temperature of approximately 100 to 400 C.

In some implementations, the predefined number of cycles is approximately 3 to 10 cycles.

In some implementations, the thermal treatment causes bonding of at least a portion of the zinc to oxygen at the interface to form the adhesive barrier.

In some implementations, the migration of the zinc causes at least a portion of the zinc to fill grain boundaries of the ruthenium liner that are along the interface.

In some implementations, the feature does not include an adhesive layer prior to the deposition of the ruthenium liner.

In some implementations, the feature defines an interconnect to an underlying conductor, wherein a portion of the ruthenium liner contacts the underlying conductor.

In some implementations, the method further includes: after the predefined number of cycles is reached, depositing a conductive material over the ruthenium liner to fill the feature of the substrate.

In some implementations, the conductive material includes copper, cobalt, or ruthenium.

In some implementations, a method is provided, including the following operations: depositing a liner in a feature of a substrate, wherein the feature defines an interconnect to an underlying conductor, wherein a portion of the liner contacts the underlying conductor; depositing a monolayer of an electronegative element over the liner by an underpotential deposition process, the underpotential deposition process including deposition from a plating solution at a potential that avoids electroplating from the plating solution; after depositing the monolayer, performing a thermal treatment on the substrate, wherein the thermal treatment is configured to cause migration of the electronegative element to an interface of the liner and a dielectric layer of the substrate, the migration of the electronegative element producing an adhesive barrier at the interface that improves adhesion between the liner and the dielectric layer of the substrate; repeating the operations of depositing the monolayer of the electronegative element and performing the thermal treatment until a predefined number of cycles is reached.

In some implementations, the thermal treatment is defined by annealing at a temperature of approximately 100 to 400 C.

In some implementations, the predefined number of cycles is approximately 3 to 10 cycles.

In some implementations, the thermal treatment causes bonding of at least a portion of the electronegative element to oxygen at the interface to form the adhesive barrier.

In some implementations, the migration of the electronegative element causes at least a portion of the zinc to fill grain boundaries of the ruthenium liner that are along the interface.

In some implementations, the feature does not include an adhesive layer prior to the deposition of the liner.

In some implementations, the method further includes: after the predefined number of cycles is reached, depositing a conductive material over the liner to fill the feature of the substrate.

In some implementations, the conductive material includes copper, cobalt, or ruthenium.

BRIEF DESCRIPTION OF THE DRAWINGS

FIGS. 5A-5F conceptually illustrate a process flow for via metallization enabled by formation of a self-forming barrier/adhesion layer, in accordance with implementations of the disclosure.

FIGS. 6A-6D illustrate a process for generating a self-forming adhesion/barrier layer for ruthenium metallization, in accordance with implementations of the disclosure.

FIGS. 7A-7F illustrate a process for generating a self-forming zinc-based barrier in a via, in accordance with implementations of the disclosure.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

In keeping with Moore's Law, there has been a continual drive towards smaller and smaller feature sizes in the semiconductor industry. At present, semiconductor manufacturers are commonly producing devices with a 28 nanometer (nm) feature size, or approximately 28 nm pitch. Devices with a 36 nm pitch size are expected to soon. Typically, the pitch is halved every two technology nodes. Thus, it is expected that within about two to three nodes, devices will be at an 18 nm pitch, or about 10 nm feature size or less.

However, as pitch and feature dimensions shrink, so resistance begins to play a larger role in circuit performance. This is attributable to a couple of effects as device features shrink. First, the conductor shrinks when feature sizes a reduced, thereby increasing the resistance. And second, the resistive impact of layers and materials other than the conductor may become more pronounced as feature sizes shrink. This can be due to the fact that in smaller features, the non-conductor materials occupy an increased proportion of the available feature volume relative to that of the conductor material. This can be especially true in the case of a via or interconnect structure.

Figure 1:
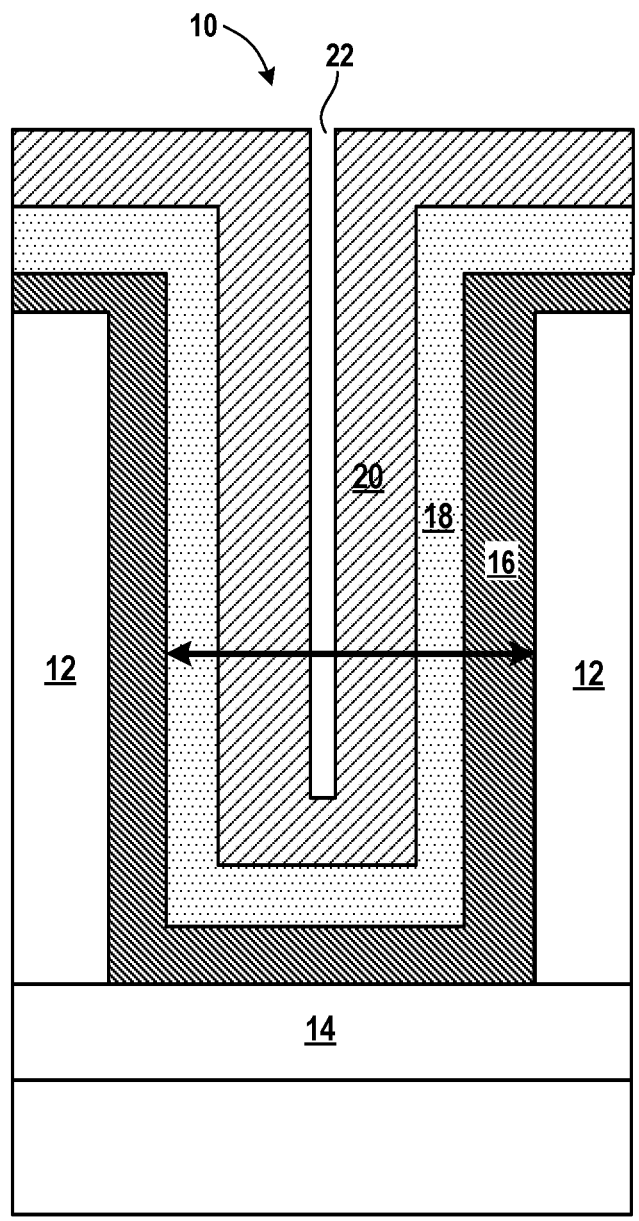
FIG. 1 conceptually illustrates a via/interconnect having various layers of material deposited therein, in accordance with implementations of the disclosure.

FIG. 1 conceptually illustrates a via/interconnect having various layers of material deposited therein, in accordance with implementations of the disclosure. In the illustrated example, the via 10 has an approximate 10 nm feature size (20 nm pitch) and has been processed according to a conventional approach for via fill. The via 10 is patterned in a dielectric material 12 of a substrate, such as an oxide or low-k dielectric material, so as to reach an underlying conductor 14. First, a barrier layer 16 (e.g. TiN, TaN, WN, etc.) is deposited in the via, to prevent diffusion and electromigration of the via conductor 22. Because of poor adhesion between the barrier layer 16 and the conductive material (e.g. Cu) of the later deposited via conductor 22, a liner layer 18 (e.g. Ti, Ta, W, etc.) is deposited over the barrier layer 16 to promote adhesion. Next, a seed layer 20 of the conductive material (e.g. Cu) is deposited over the liner layer 18. The seed layer is deposited by physical vapor deposition (PVD) so as to form a conformal layer and to provide nucleation sites for bulk deposition. Then the bulk deposition/fill (e.g. typically by electroplating) of the conductive material is deposited to form the conductor 22.

However, as conceptually demonstrated by FIG. 1, this typical process scales poorly for small feature sizes such as 10 nm. For the barrier and seed layers consume a significant amount of the cross-sectional space in the via 10, leaving little room for the actual conductor 22. This can be problematic from a processing standpoint as the narrow available space for fill increases the likelihood of the formation of voids during the fill deposition process. Further, the narrow conductor at small feature sizes increases the resistance. Also, the barrier layer 16 acts as a resistive contact between the via structure and the underlying conductor 14. As can be seen, the issue of high resistance is problematic when extending current processes to small feature sizes, as the increased resistance will degrade device performance.

Thus, it would be desirable to enable an interconnect process that provides for a structure consisting of predominantly conductive material to minimize the resistance of the conductor, with a thin barrier that is selectively deposited on the sidewalls only. A metallic contact is desired to act as a flux divergence layer to prevent electromigration.

Implementations of the present disclosure provide methods and systems to address the problems described above which are inherent to conventional processes when extended to 10 nm feature sizes, by enabling a barrier-less metallization scheme. Broadly speaking, it has been discovered that a low temperature anneal of a zinc layer in an interconnect structure causes the zinc to migrate to the interface with the oxide and form a (self-forming) barrier that prevents electromigration and diffusion of copper, while also improving adhesion of a Ru liner.

Currently, a lined feature consisting only of a Ru (or Co) liner over a dielectric (e.g. SiO2) is not suitable for directly depositing Cu because of its poor adhesion and barrier properties. However, in accordance with implementations of the disclosure, to enable the Cu metallization process directly onto the liner, the liner is doped with an electronegative metal (X). Under the application of a heat treatment, the doped metal (X) migrates to the Ru—SiO2 interface and reacts with SiO2 forming a thin layer of metal silicate at the oxide interface, providing better adhesion and barrier properties for the direct Cu metallization. In an alternative approach this technique can be extended to Ru (or Co) metallization, which is useful for the back-end-of-line metallization process.

This approach provides a pathway for enabling Cu/Ru metallization directly onto the liner material without the need for the barrier layer (TaN). The adhesion and barrier properties of the liner are addressed by electrochemically doping an element (e.g. X=Zn) by underpotential deposition, forming a Zn self-forming adhesion layer. This adhesion layer provides a pathway for a barrier-less metallization scheme. The dopant employed should be capable of diffusing and reacting with SiO2 upon employing a heat treatment process. Dopants more electronegative than Zn can also be applied using this approach.

This approach can also be implemented using (X=Mn) as a dopant. Mn exhibits underpotential deposition on Ru/Cu which can be driven into the metal oxide interface with a suitable heat treatment process. This provides an improved adhesion layer for direct Cu metallization for a barrier-less metallization scheme.

FIGS. 2A-2G conceptually illustrate a process demonstrating formation of a zinc self-forming barrier on a blanket ruthenium liner on a thermal oxide wafer, in accordance with implementations of the disclosure.

Figure 2:
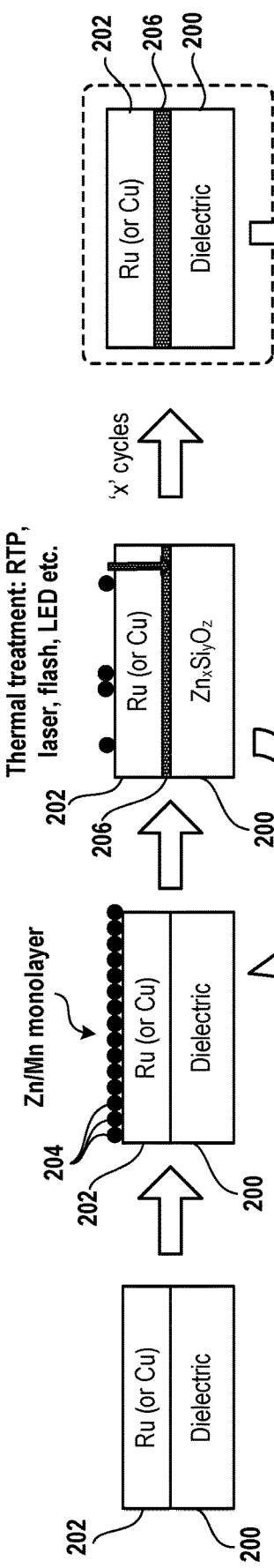
FIGS. 2A-2G conceptually illustrate a process demonstrating formation of a zinc self-forming barrier on a blanket ruthenium liner on a thermal oxide wafer, in accordance with implementations of the disclosure.

FIG. 2A conceptually illustrates a portion of a substrate, wherein a ruthenium (Ru) layer 202 is deposited over a dielectric layer 200. It will be noted that no separate barrier layer is deposited between the ruthenium layer 202 and the dielectric layer 200. In some implementations, a copper layer or a cobalt layer is deposited instead of a ruthenium layer.

Then, as shown at FIG. 2B, a monolayer 204 of zinc (Zn) is deposited over the ruthenium layer 202. In some implementations, a monolayer of manganese (Mn) is deposited instead of zinc.

In some implementations, the monolayer of zinc is deposited by an underpotential deposition (UPD) process. Underpotential deposition will be understood as the electrodeposition of a species at a potential that is less negative than the equilibrium (Nernst) potential for the reduction of the species. In other words, the potential is held at a level that promotes monolayer adsorption of the metal on the substrate while avoiding bulk deposition (electroplating).

In some implementations, the monolayer of zinc is deposited by an electroless UPD process.

In still other implementations, a layer of zinc (that is not necessarily a monolayer) is deposited by an electroplating process. True monolayer-level control of deposition may not be possible with an electroplating process. However, such a process can still be tailored to provide a desired amount of zinc.

With reference to FIG. 2C, a thermal treatment is performed. It will be appreciated that in various implementations, various types of thermal treatment processes can be applied. In some implementations, the thermal treatment is a rapid thermal process (RTP). In some implementations, such a rapid thermal process employs radiant sources such as high intensity lamps or lasers, applied singly, sequentially or in combination, and where the radiant source may be continuous or pulsed. In some implementations, the rapid thermal process is a rapid thermal anneal (RTA). In some implementations, the thermal treatment employs a heated chuck, a heated plate, lamps, lasers, LEDs, or any other heating hardware that may be configured to apply thermal energy to the wafer/substrate.

As shown, under the application of the heat treatment, the zinc migrates to the interface between the ruthenium layer 202 and the dielectric layer 200, forming a self-formed barrier/adhesion layer 206 at the interface. Without being bound by any particular theory of operation, it is nonetheless believed that the zinc, being electronegative, is attracted towards the oxide (dielectric), and the resulting migration of zinc towards the oxide is accelerated under the influence of the heat treatment. It is further believed that at least some of the zinc that has migrated reacts with the oxide to form a silicate that improves adhesion and barrier properties.

Furthermore, it is believed that the zinc also fills the grain boundaries of the ruthenium layer, especially at the interface, and that this blocks the diffusion pathway through the ruthenium layer for any other material (e.g. copper deposited over the ruthenium layer). In sum, it is believed that the heat treatment causes migration of zinc to the ruthenium-oxide interface, and further causes formation of a silicate at the interface as well as stuffing of the ruthenium grain boundaries, and that these processes produce a self-formed adhesion/barrier layer at the interface.

Following the heat treatment of FIG. 2C, the process may return to the monolayer deposition operation of FIG. 2B, to deposit another monolayer of zinc, followed by subsequent performance of the heat treatment operation of FIG. 2C again. In some implementations, this cycle is repeated until a predefined number of cycles of deposition and heat treatment have been performed. In some implementations, this cycle is repeated until a desired amount of zinc is deposited, or until the self-formed barrier/adhesion layer 206 reaches a desired metric, such as a certain level of adhesion or level of effectiveness as a barrier.

After the desired number of cycles have been performed, the adhesion/barrier layer 206 is formed, as shown at FIG. 2D.

For purposes of demonstrating the effectiveness of the approach herein described in accordance with implementations of the disclosure, a 3 nm Ru layer (ref. 202) was deposited over a 100 nm thermal oxide (SiO2) dielectric layer (ref. 200), as shown at FIG. 2A. The zinc monolayer 204 was deposited by underpotential deposition, as shown at FIG. 2B. The underpotential deposition was performed at −1.15 volts vs. SCE in 1 mM ZnSO4 solution (pH 11.2). A thermal treatment was performed as shown at FIG. 2C. The monolayer deposition and heat treatment were performed for a total of eight cycles.

Continuing at FIG. 2E, following the eight cycles of deposition/thermal treatment, a copper cap 208 was deposited over the ruthenium layer 202. The copper cap 208 was deposited by electroless deposition to a thickness of about 60 nm.

Following the copper cap deposition, a forming gas anneal was performed at 360 degrees Celsius for 30 minutes. With reference to FIG. 2F, the purpose was to determine whether copper from the copper cap 208 would be able to diffuse through the ruthenium layer 202 under the forming gas anneal, or if the zinc adhesion/barrier layer 206 would prevent this from occurring.

With reference to FIG. 2G, a wet etch was performed to remove the copper cap 208 and expose the underlying layers for analysis.

Figure 3:
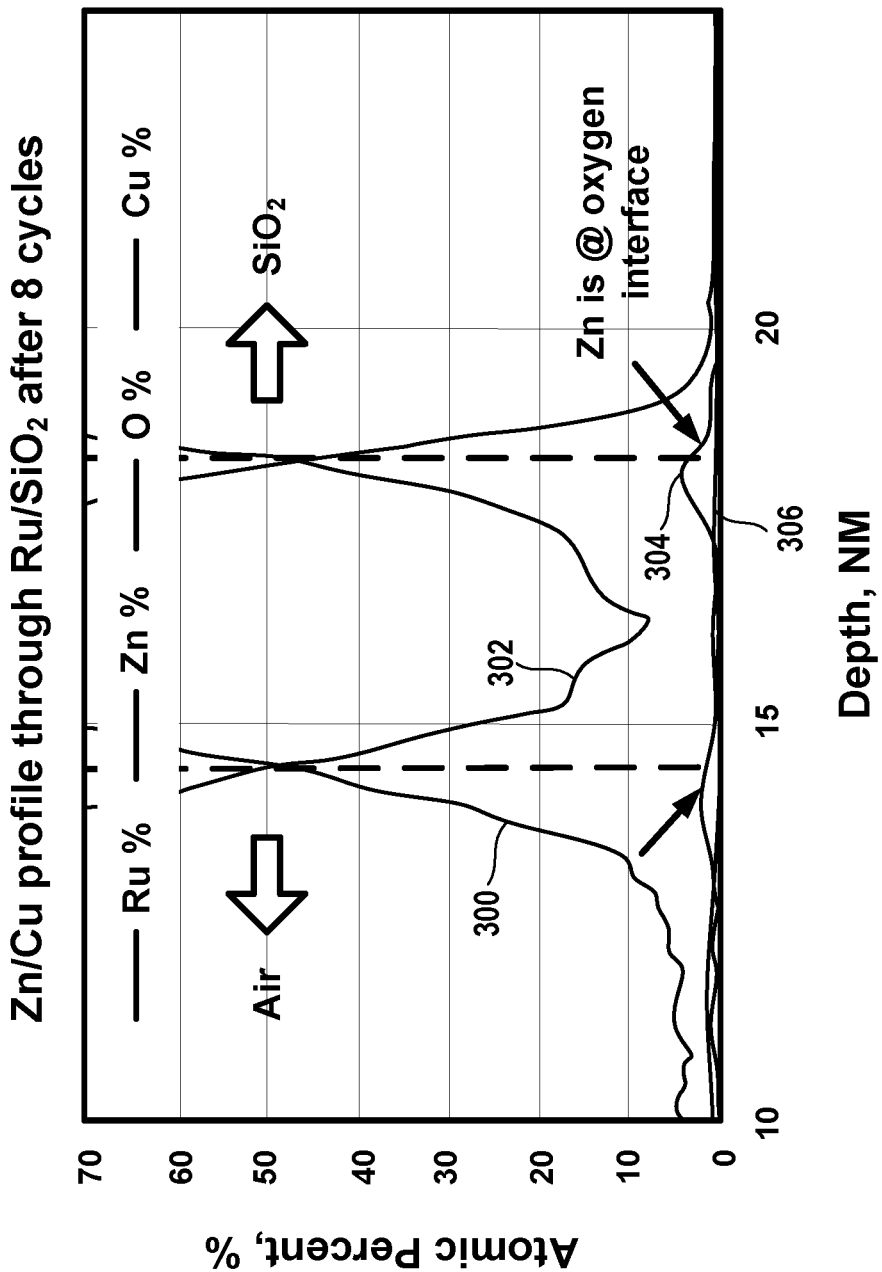
FIG. 3 is an electron energy loss spectroscopy (EELS) profile of the sample processed in accordance with the above-described operations, in accordance with implementations of the disclosure.

FIG. 3 is an electron energy loss spectroscopy (EELS) profile of the sample processed in accordance with the above-described operations, in accordance with implementations of the disclosure. The plot shown illustrates a depth profile of a thickness spanning the ruthenium layer, the zinc adhesion/barrier layer, and the silicon dioxide layer. The atomic percentage of ruthenium as a function of depth is shown by the curve 300, the atomic percentage of oxygen by the curve 302, the atomic percentage of zinc by the curve 304, and the atomic percentage of copper by the curve 306.

As indicated by the various atomic percentage depth profiles, there is an accumulation of zinc at the interface between the ruthenium and the silicon dioxide, thus demonstrating that the zinc has migrated from being initially deposited on the ruthenium layer, through the ruthenium to the interface with the silicon dioxide. However, there is no copper observed in the ruthenium, and no diffusion of copper through the ruthenium into the silicon dioxide. This is significant as it demonstrates the diffusion-inhibiting property of the zinc-containing barrier/adhesion layer at the interface of Ru and SiO2.

Figure 4:
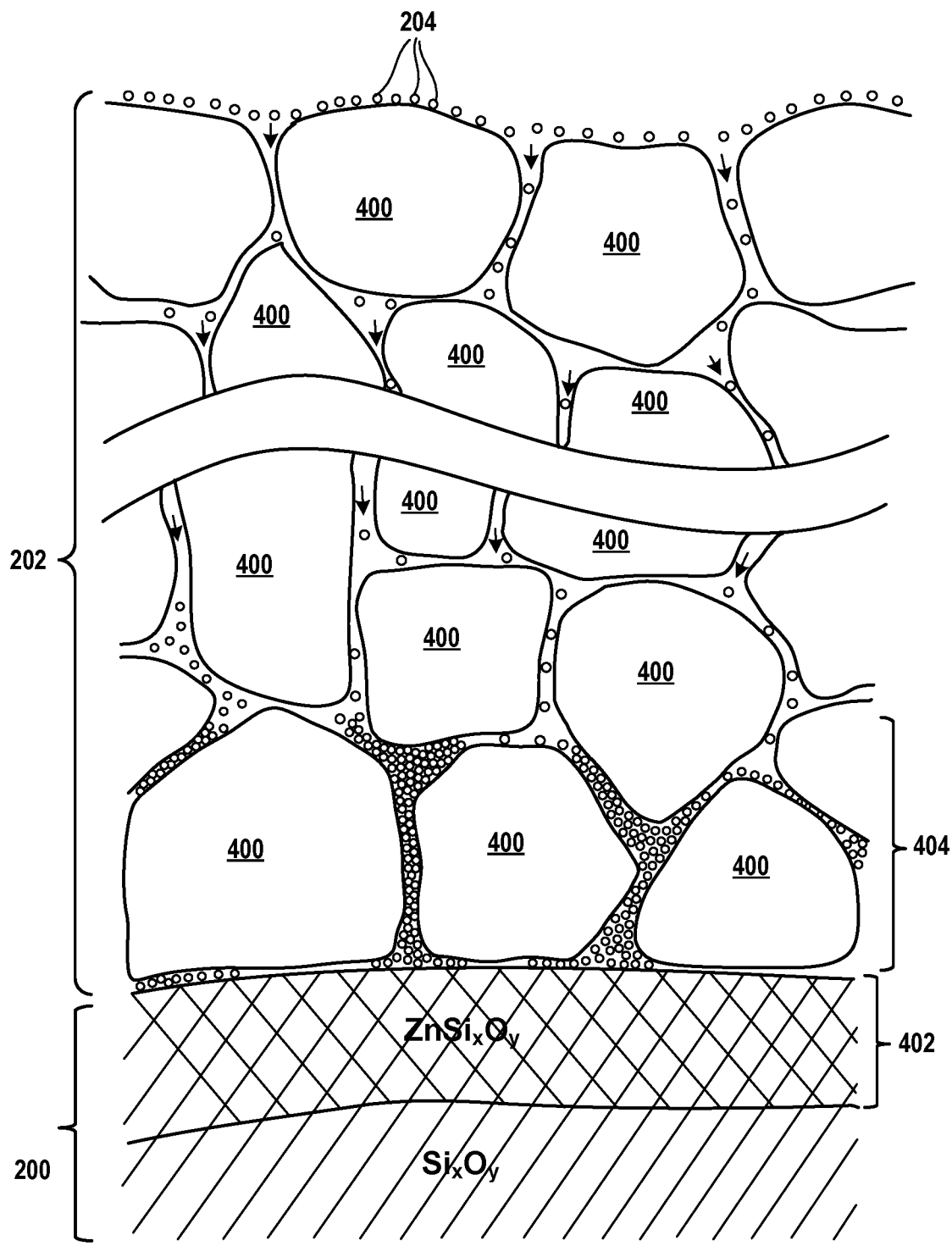
FIG. 4 conceptually illustrates a cross-section of a portion of a substrate, in accordance with implementations of the disclosure.

FIG. 4 conceptually illustrates a cross-section of a portion of a substrate, in accordance with implementations of the disclosure. In the illustrated implementation, a layer 202 of ruthenium (or cobalt) has been deposited over a layer 200 of an oxide dielectric (e.g. SixOy). Successive cycles of deposition and thermal treatment have been performed, each cycle consisting of a monolayer deposition of zinc (or another electronegative element, e.g. manganese) followed by a thermal treatment that drives the zinc to the interface of the ruthenium and the dielectric. In some implementations, the monolayer deposition is performed by underpotential deposition or by electroless underpotential deposition.

As shown, the ruthenium layer 202 is composed of ruthenium grains 400. The zinc particles from the deposited monolayer 204 of zinc migrate through the grain boundaries between the ruthenium grains 400, towards the oxide dielectric 200. Upon reaching the oxide dielectric 200, the zinc reacts with the top portion of the oxide dielectric layer 200, converting it to form a silicate (e.g. ZnSixOy) layer 402.

Furthermore, as the zinc migrates through the grain boundaries, it fills the grain boundaries and thereby blocks the grain boundaries as a potential diffusion pathway for other materials, such as a subsequently deposited conductor such as copper. As shown in the illustrated implementation, as the zinc migrates through the ruthenium, it accumulates and "stuffs" the grain boundaries initially in the region 404 of the ruthenium that is at or nearest to the interface with the dielectric layer 200. With successive cycles of monolayer deposition of zinc and thermal treatment, the region of the ruthenium that is stuffed with zinc grows. In some implementations, the number of cycles of deposition and thermal treatment is configured to provide for a desired thickness of the ruthenium to have its grain boundaries filled with zinc. In some implementations, the number of cycles is configured so that the entire ruthenium layer will have its grain boundaries filled with zinc.

In view of the foregoing, various process flows are contemplated for via metallization using a metallic liner doped with an electronegative element (such as Zn) which can be driven to the metal oxide interface upon heat treatment where it forms a silicate diffusion barrier. This allows for back-end scaling by mitigating via resistance and via reliability which is a major bottleneck for future technology nodes.

FIGS. 5A-5F conceptually illustrate a process flow for via metallization enabled by formation of a self-forming barrier/adhesion layer, in accordance with implementations of the disclosure. Conceptually shown at FIG. 5A is a cross section of a portion of a substrate having an etched via 500 prior to fill processing. The via 500 is configured to enable formation of an interconnect to an underlying conductor 506 (e.g. a copper line). The via 500 has been etched from a dielectric material 502 (e.g. SixOy), and an etch stop layer 504 and/or capping layer has been etched/removed from the bottom of the via 500, to expose the underlying conductor 506.

With reference to FIG. 5B, a ruthenium (Ru) liner 508 (in some implementations, a cobalt (Co) liner) is deposited in the via 500, the ruthenium liner 508 being deposited on the dielectric material 502 sidewalls of the via 500 and on the underlying conductor 506 at the bottom of the via 500. In some implementations, the ruthenium liner 508 is deposited to have a thickness in the range of about 1 to 3 nm; in some implementations, 1 to 2 nm. The ruthenium liner 508 is deposited by a conformal deposition method, e.g. chemical vapor deposition (CVD), atomic layer deposition (ALD), electroplating, etc. The ruthenium liner 508 provides a boundary to the conductors which it is adjacent to, acting as a flux divergence layer and inhibiting electromigration.

With reference to FIG. 5C, a monolayer 510 of an electronegative element (e.g. zinc, manganese, etc.) is deposited on the ruthenium liner 508. In some implementations, the monolayer 510 is deposited by an underpotential deposition process. In some implementations, the monolayer 510 is deposited by an electroless UPD process. In still other implementations, a layer of an electronegative element, which may or may not be a monolayer specifically, can be deposited by a deposition process such as an electroless deposition process, and electroless UPD process, an electroplating process, PVD, or CVD.

For ease of description, the present implementation is described with reference to the monolayer 510 being a monolayer of zinc. However, it will be appreciated that in other implementations, other elements, that can be more electronegative than zinc, may be substituted. In some implementations, manganese is used in place of zinc.

After the monolayer deposition, with reference to FIG. 5D, a thermal heat treatment or anneal operation is performed. This causes the zinc present on the surface of the ruthenium liner 508, to be driven through the ruthenium liner 508 to the oxide dielectric 502 along the sidewalls, where it reacts to form a self-formed barrier/adhesion layer 512. As noted above, the zinc is believed to react with the oxide dielectric to form a silicate, and further the zinc is believed to fill or stuff the grain boundaries between the ruthenium grains thereby blocking the diffusion pathway through the ruthenium.

In some implementations, the anneal is performed at a temperature less than about 350 C. In some implementations, the anneal is performed at a temperature between about 40 and 450 C; in some implementations, between about 75 to 200 C; in some implementations, between about 75 to 150 C; in some implementations, about 150 C; in some implementations, between about 250 to 400 C; in some implementations, between about 300 to 350 C. In some implementations, the anneal is performed for a time of about 2 to 30 minutes; in some implementations, about 3 to 10 minutes; in some implementations, about 5 minutes. In some implementations, a flash anneal is performed, which achieves annealing very rapidly, on the order of milliseconds.

To provide additional zinc material to increase the formation of the barrier/adhesion layer, and to increase the adhesion and barrier properties of the barrier/adhesion layer 512, additional cycles of the monolayer deposition and thermal treatment can be performed. That is, the monolayer deposition and thermal treatment operations described with reference to FIGS. 5C and 5D can be cyclically repeated until a predefined number of cycles has been performed. In some implementations, at least one cycle is performed; in some implementations, at least 3 cycles are performed; in some implementations, 1 to 50 cycles are performed; in some implementations, 5 to 50 cycles are performed; in some implementations, 3 to 10 cycles are performed.

The monolayer deposition of zinc provides for conformal coverage, which can be especially useful for ensuring coverage of three-dimensional structures and/or high-aspect ratio features. Also, the monolayer deposition coupled with annealing in cycles enables very precise control over the amount of zinc that is applied and the extent to which the barrier/adhesion layer is developed.

After the desired number of cycles is reached, then with reference to FIG. 5E, a copper seed layer 514 is deposited over the ruthenium. In some implementations the copper seed layer 514 is deposited by a CVD, PVD, or ALD process so as to form a conformal layer of copper and to provide nucleation sites for bulk deposition.

With reference to FIG. 5F, following the deposition of the copper seed layer 514, bulk deposition/fill of copper is performed to deposit a bulk copper layer 516. In some implementations, the bulk deposition is performed by electroplating, electroless deposition, or another deposition process.

It should be noted that though the zinc monolayer 510 is conformally deposited throughout the surface regions of the via 500, including at the bottom of the via, the zinc is selective for the oxide dielectric. That is, within the via, the zinc selectively migrates towards the oxide sidewalls of the via, where it reacts as previously described to form the zinc-based adhesion/barrier layer 512. Thus, the zinc present at the bottom of the via also migrates towards the sidewalls, and the resulting adhesion/barrier layer 512 is selectively formed along the sidewalls of the via. The adhesion/barrier layer 512 thus is not formed in the bottom region of the via where the contact to the underlying conductor 506 is made, and therefore does not add to the resistance of the contact. Following completion of the described process, the bottom region consists of copper and ruthenium only, yielding a highly conductive contact, with the ruthenium liner 508 acting as a flux divergence layer.

While implementations have been described with reference to deposition of zinc for purposes of forming a self-forming adhesion/barrier layer, in other implementations, other electronegative elements such as manganese may be employed. Also, while implementations have been described with reference to copper metallization (including deposition of the copper seed layer and bulk copper deposition), in various implementations, various conductive materials for metallization can be used, including copper, cobalt, nickel, ruthenium, and alloys thereof.

FIGS. 6A-6D illustrate a process for generating a self-forming adhesion/barrier layer for ruthenium metallization, in accordance with implementations of the disclosure. Conceptually shown at FIG. 6A is a cross section of a portion of a substrate having an etched via 600 prior to fill processing. The via 600 is configured to enable formation of an interconnect to an underlying conductor 606 (e.g. a copper line). The via 600 has been etched from a dielectric material 602 (e.g. $Si_xO_y$), and an etch stop layer 604 and/or capping layer has been etched/removed from the bottom of the via 600, to expose the underlying conductor 606.

With reference to FIG. 6B, a ruthenium (or cobalt) deposition process is performed, so as to deposit a layer 620 of ruthenium (or cobalt) in the via 600.

Subsequently, with reference to FIG. 6C, a monolayer 622 of zinc is deposited over the layer 620 of ruthenium. In some implementations, the monolayer 622 of zinc is deposited by an underpotential deposition process or an electroless underpotential deposition process. As has been noted previously, in still other implementations, a layer of zinc, that may or may not be a monolayer, can be deposited by various deposition methods, including electroless deposition, electroplating, PVD, or CVD.

Then, with reference to FIG. 6D, an anneal or heat treatment process is performed, causing the deposited zinc to migrate through the ruthenium layer to the dielectric interface, where it forms a self-forming adhesion/barrier layer 624. Successive cycles of the monolayer deposition and heat treatment operations of FIGS. 6C and 6D are performed until a predefined number of cycles has been performed, or a predefined characteristic of the adhesion/barrier layer is achieved. The adhesion/barrier layer 624 provides for improved adhesion between the ruthenium and the dielectric, thus improving device reliability.

Implementations of the present disclosure also address the via resistance and reliability issues that plague current via metallization processes by providing a pathway for enabling Cu via pre-fill which yields low via resistance. Furthermore, via reliability which prevented implementation of Cu via pre-fill can be addressed by a Zn self-forming barrier/adhesion layer. This adhesion layer between Cu and the dielectric retards electromigration, improving reliability.

Implementations of the disclosure also improve electromigration, diffusion and adhesion characteristics of electroless cobalt or nickel via pre-fill flow. Zinc can be driven to the metal/dielectric interface creating an adhesive layer which retards metal diffusion and electromigration.

FIGS. 7A-E illustrate a process for generating a self-forming zinc-based barrier in a via, in accordance with implementations of the disclosure. With reference to FIG. 7A, after performance of etch and clean processes, a cross section of a via 700 that has been etched from a dielectric 702 is shown. The via 700 is configured to enable connection to an underlying conductor 706, that consists of a conductive material such as copper. An etch stop layer 704 has been removed at the bottom of the via, exposing the underlying conductor 706 for contact with subsequently deposited material.

With reference to FIG. 7B, a via pre-fill operation is performed, to deposit in the via 700 a pre-fill layer 710 consisting of a conductive material (e.g. Cu, Co, Ni, alloy, etc.). The pre-fill operation is configured to partially fill the via 700, so that the pre-fill layer 180 occupies a bottom portion of the via 700.

With reference to FIG. 7C, a ruthenium liner 720 (in some implementations, a cobalt liner) is deposited over the via. In some implementations, the Ru liner 720 is deposited to have a thickness in the range of about 1 to 3 nm; in some implementations, 1 to 2 nm. The Ru liner 720 is deposited by a conformal deposition method, e.g. CVD, ALD, electroplating. The Ru liner 720 provides a boundary to the conductors which it is adjacent to, acting as a flux divergence layer and inhibiting electromigration.

With reference to FIG. 7D, a zinc monolayer 722 is deposited by a conformal deposition method (e.g. underpotential deposition, electroless underpotential deposition). In other implementations, a layer of zinc, which may or may not specifically be a monolayer, can be deposited by a conformal deposition method such as electroless deposition, electroplating, PVD, or CVD. In some implementations, other electronegative species can be used instead of zinc, such as manganese.

With reference to FIG. 7E, a heat treatment or anneal operation is performed. This causes the zinc to be driven through the metallic layers to the oxide dielectric, where it reacts to form the self-formed barrier/adhesion layer 724.

The monolayer deposition and heat treatment operations of FIGS. 7D and 7E are repeated until a predefined number of cycles have been performed, or until a desired characteristic of the barrier/adhesion layer 724 is achieved (e.g. a level of adhesion, level of diffusion inhibiting ability, thickness, quantity of zinc, etc.).

Following the formation of the barrier/adhesion layer 724 through the repeated cycles of monolayer deposition and heat treatment, then with reference to FIG. 7F, a copper fill operation is performed, to deposit a copper fill layer 726 over the via. The copper fill operation is performed via electrochemical plating, electroless deposition, or another deposition method suitable for bulk deposition of copper.

Implementations in accordance with the principles of the present disclosure provide for doping of an electronegative element directly onto the liner material (Ru, Co) via electrochemical underpotential deposition. Implementations have generally been described with reference to a ruthenium liner; however, in other implementations, a cobalt liner is applied.

The amount of an electronegative element (e.g. Zn, Mn) incorporated into the liner/oxide interface can be controlled by the number of underpotential deposition steps together with a suitable heat treatment process.

As demonstrated, this allows several integration flows for direct Cu/Ru metallization using liner materials doped with an electronegative element.

Though implementations have been described with reference to zinc, process flows employing Mn can be similarly doped using an electrochemical underpotential deposition process directly onto a metal of interest such as Ru, Co, or Cu.

In some implementations, process flows are configured where the electronegative element can be doped for other non-copper metallization processes such as Ru metallization.

In some implementations, the entire process flow can be performed using wet deposition processes.

Figure 8:
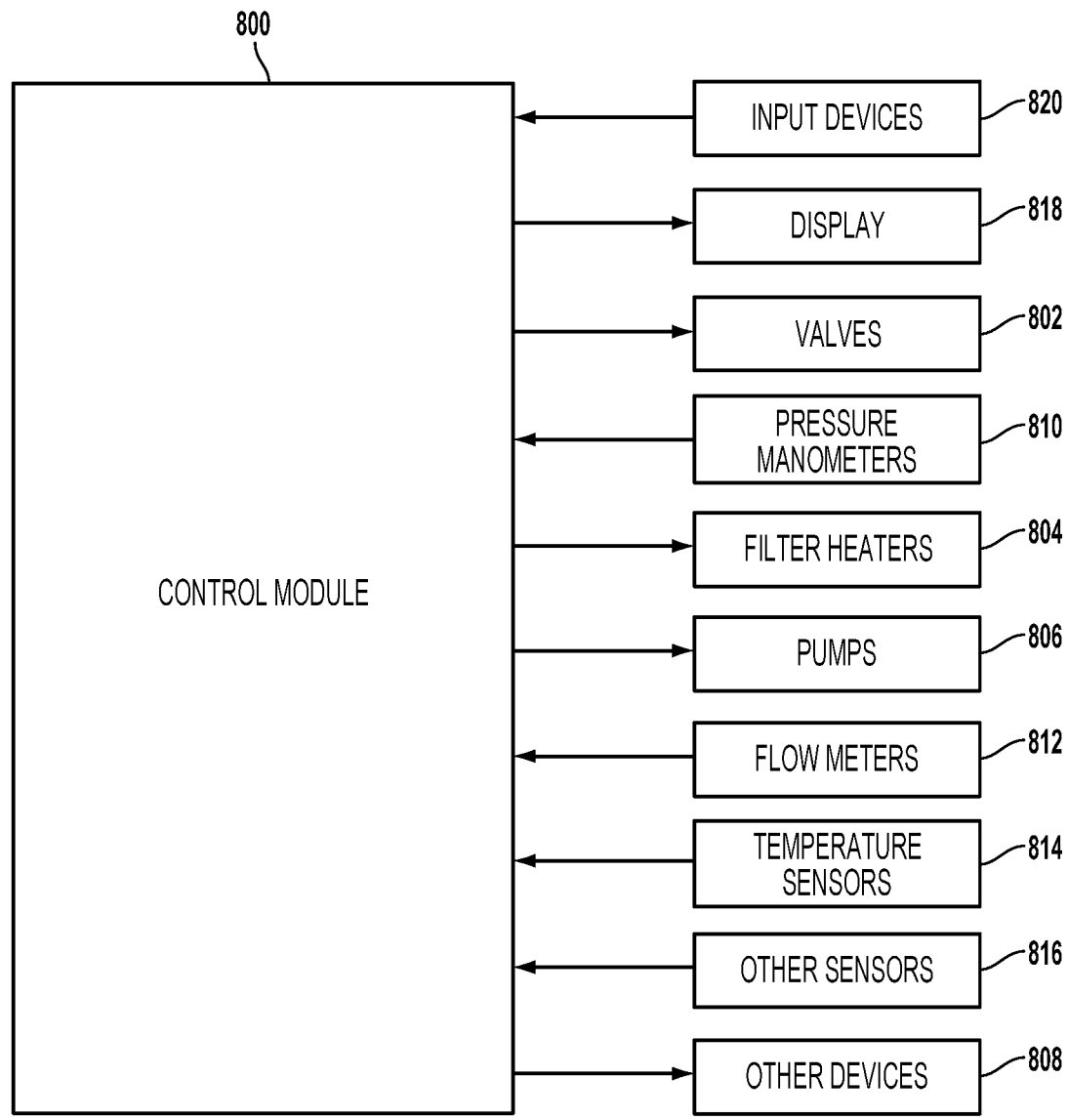
FIG. 8 shows a control module for controlling the systems described above, in accordance with implementations of the disclosure.

FIG. 8 shows a control module 800 for controlling systems for performing operations described above, in accordance with implementations of the disclosure. For instance, the control module 800 may include a processor, memory and one or more interfaces. The control module 800 may be employed to control devices in the system based in part on sensed values. For example only, the control module 800 may control one or more of valves 802, filter heaters 804, pumps 806, and other devices 808 based on the sensed values and other control parameters. The control module 800 receives the sensed values from, for example only, pressure manometers 810, flow meters 812, temperature sensors 814, and/or other sensors 816. The control module 800 may also be employed to control process conditions during reactant delivery and plasma processing. The control module 800 will typically include one or more memory devices and one or more processors.

The control module 800 may control activities of the reactant delivery system and plasma processing apparatus. The control module 800 executes computer programs including sets of instructions for controlling process timing, delivery system temperature, pressure differentials across the filters, valve positions, mixture of gases, chamber pressure, chamber temperature, wafer temperature, RF power levels, wafer ESC or pedestal position, and other parameters of a particular process. The control module 800 may also monitor the pressure differential and automatically switch vapor reactant delivery from one or more paths to one or more other paths. Other computer programs stored on memory devices associated with the control module 800 may be employed in some embodiments.

Typically there will be a user interface associated with the control module 800. The user interface may include a display 818 (e.g. a display screen and/or graphical software displays of the apparatus and/or process conditions), and user input devices 820 such as pointing devices, keyboards, touch screens, microphones, etc.

Computer programs for controlling delivery of reactant, plasma processing and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

Although the foregoing embodiments have been described in some detail for purposes of clarity of understanding, it will be apparent that certain changes and modifications may be practiced within the scope of the disclosed embodiments. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method, comprising:
depositing a liner in a feature of a substrate, wherein the feature defines an interconnect to an underlying conductor, wherein a portion of the liner contacts the underlying conductor;
depositing a monolayer of an electronegative element over the liner by an underpotential deposition process, the underpotential deposition process including deposition from a plating solution at a potential that is less negative than an equilibrium potential for reduction of the electronegative element and enables monolayer adsorption of the electronegative element on the liner while avoiding electroplating of the electronegative element from the plating solution;
after depositing the monolayer, performing a thermal treatment on the substrate, wherein the thermal treatment is configured to cause migration of the electronegative element to an interface of the liner and a dielectric layer of the substrate, the migration of the electronegative element producing an adhesive barrier at the interface that improves adhesion between the liner and the dielectric layer of the substrate;
repeating the operations of depositing the monolayer of the electronegative element and performing the thermal treatment until a predefined number of cycles is reached.

2. The method of claim 1, wherein the thermal treatment is defined by annealing at a temperature of approximately 100 to 400 C.

3. The method of claim 1, wherein the predefined number of cycles is approximately 3 to 10 cycles.

4. The method of claim 1, wherein the thermal treatment causes bonding of at least a portion of the electronegative element to oxygen at the interface to form the adhesive barrier.

5. The method of claim 1, wherein the migration of the electronegative element causes at least a portion of the electronegative element to fill grain boundaries of the liner that are along the interface.

6. The method of claim 1, wherein the feature does not include an adhesive layer prior to the deposition of the liner.

7. The method of claim 1, further comprising:
after the predefined number of cycles is reached, depositing a conductive material over the liner to fill the feature of the substrate.

8. The method of claim 7, wherein the conductive material includes copper, cobalt, or ruthenium.

9. A method, comprising:
depositing a liner in a feature of a substrate;
depositing a monolayer of zinc over the liner;
after depositing the monolayer of zinc, performing a thermal treatment on the substrate, wherein the thermal treatment is configured to cause migration of the zinc to an interface of the liner and an oxide layer of the substrate, the migration of the zinc producing an adhesive barrier at the interface that improves adhesion between the liner and the oxide layer of the substrate;
repeating the operations of depositing the monolayer of zinc and performing the thermal treatment until a predefined number of cycles is reached.

10. The method of claim 9, wherein depositing the monolayer of zinc is performed by an underpotential deposition process, the underpotential deposition process including deposition from a plating solution at a potential that avoids electroplating from the plating solution.

11. The method of claim 9, wherein depositing the monolayer of zinc is performed by an electroless underpotential deposition process.

12. The method of claim 9, wherein the thermal treatment is defined by annealing at a temperature of approximately 100 to 400 C.

13. The method of claim 9, wherein the predefined number of cycles is approximately 3 to 10 cycles.

14. The method of claim 9, wherein the thermal treatment causes bonding of at least a portion of the zinc to oxygen at the interface to form the adhesive barrier.

15. The method of claim 9, wherein the migration of the zinc causes at least a portion of the zinc to fill grain boundaries of the liner that are along the interface.

16. The method of claim 9, wherein the feature does not include an adhesive layer prior to the deposition of the liner.

17. The method of claim 9, wherein the feature defines an interconnect to an underlying conductor, wherein a portion of the liner contacts the underlying conductor.

18. The method of claim 9, further comprising:
after the predefined number of cycles is reached, depositing a conductive material over the liner to fill the feature of the substrate.

19. The method of claim 18, wherein the conductive material includes copper, cobalt, or ruthenium.

* * * * *